United States Patent
Sato (10) Patent No.: US 8,754,465 B2
(45) Date of Patent: Jun. 17, 2014

(54) SEMICONDUCTOR DEVICE WITH FIXED CHARGE LAYERS

(75) Inventor: Motoyuki Sato, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/603,704

(22) Filed: Sep. 5, 2012

(65) Prior Publication Data

US 2013/0248966 A1 Sep. 26, 2013

(30) Foreign Application Priority Data

Mar. 23, 2012 (JP) ................................ 2012-068329

(51) Int. Cl.
*H01L 29/788* (2006.01)
(52) U.S. Cl.
USPC ........ 257/315; 257/316; 257/321; 257/E29.3; 257/E29.308
(58) Field of Classification Search
USPC ............... 257/315, 316, 321, E29.3, E29.308
See application file for complete search history.

(56) References Cited

U.S. PATENT DOCUMENTS

| | | | |
|---|---|---|---|
| 5,639,679 A | 6/1997 | Muramatu | |
| 6,285,596 B1 | 9/2001 | Miura et al. | |
| 7,928,500 B2 | 4/2011 | Sekine et al. | |
| 2005/0184327 A1* | 8/2005 | Ozawa | 257/302 |
| 2011/0122698 A1* | 5/2011 | Izumida et al. | 365/185.18 |
| 2011/0175187 A1* | 7/2011 | Ueno et al. | 257/437 |
| 2011/0204433 A1 | 8/2011 | Fujita et al. | |

FOREIGN PATENT DOCUMENTS

| | | |
|---|---|---|
| JP | 8-46066 | 2/1996 |
| JP | 2006-269749 | 10/2006 |
| JP | 2009-130120 | 6/2009 |
| JP | 2011-14921 | 1/2011 |
| JP | 2011-176207 | 9/2011 |

* cited by examiner

*Primary Examiner* — Robert Huber
(74) *Attorney, Agent, or Firm* — Oblon, Spivak, McClelland, Maier & Neustadt, L.L.P.

(57) ABSTRACT

According to one embodiment, a semiconductor device includes a semiconductor substrate, a tunnel insulating film on the semiconductor substrate, a first floating gate electrode on the tunnel insulating film, an inter-floating gate insulating film on the first floating gate electrode, a second floating gate electrode on the inter-floating gate insulating film, an inter-electrode insulating film on the second floating gate electrode, and a control gate electrode on the inter-electrode insulating film. The inter-floating gate insulating film includes a main insulating film, and a first fixed charge layer between the main insulating film and the second floating gate electrode and having negative fixed charges.

19 Claims, 7 Drawing Sheets

SEMICONDUCTOR DEVICE WITH FIXED CHARGE LAYERS

CROSS-REFERENCE TO RELATED APPLICATIONS

This application is based upon and claims the benefit of priority from Japanese Patent Application No. 2012-068329, filed Mar. 23, 2012, the entire contents of which are incorporated herein by reference.

FIELD

Embodiments described herein relate generally to a semiconductor device and a method of manufacturing the same.

BACKGROUND

As nonvolatile semiconductor memory devices such as a NAND flash memory become finer, degradation in the data retention characteristic poses a problem.

To cope with this problem, there has been proposed a double floating gate structure in which a floating gate is formed from two layers. In the double floating gate structure, it is important to prevent electrons from moving from the upper floating gate electrode to the lower floating gate electrode.

In the conventional double floating gate structure, however, it is difficult to sufficiently prevent electron movement from the upper floating gate electrode to the lower floating gate electrode. It is therefore difficult to obtain a nonvolatile semiconductor memory device having an excellent data retention characteristic.

DETAILED DESCRIPTION

In general, according to one embodiment, a semiconductor device includes a semiconductor substrate; a tunnel insulating film formed on the semiconductor substrate; a first floating gate electrode formed on the tunnel insulating film; an inter-floating gate insulating film formed on the first floating gate electrode; a second floating gate electrode formed on the inter-floating gate insulating film; an inter-electrode insulating film formed on the second floating gate electrode; and a control gate electrode formed on the inter-electrode insulating film. The inter-floating gate insulating film includes a main insulating film; and a first fixed charge layer formed between the main insulating film and the second floating gate electrode and having negative fixed charges.

The embodiments will now be described with reference to the accompanying drawings.

First Embodiment

FIGS. 1, 2, 3, 4, 5, and 6 are sectional views schematically showing a method of manufacturing a semiconductor device (nonvolatile semiconductor memory device) according to the first embodiment.

Figure 1:
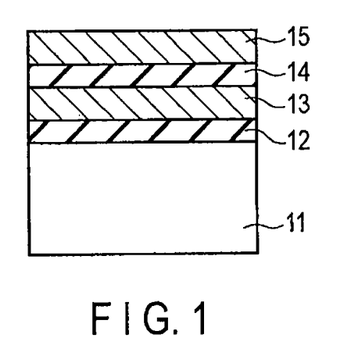
FIG. 1 is a sectional view schematically showing part of a method of manufacturing a semiconductor device according to the first embodiment.

First, as shown in FIG. 1, a tunnel insulating film 12 is formed on a semiconductor substrate 11 such as a silicon substrate. A silicon oxide film or a silicon oxynitride film is used as the tunnel insulating film 12. A first floating gate electrode film 13 is formed on the tunnel insulating film 12. A polysilicon film is used as the floating gate electrode film 13. A main insulating film 14 of an inter-floating gate insulating film is formed on the floating gate electrode film 13. The main insulating film 14 is formed from a hafnium oxide ($HfO_2$) film. The main insulating film 14 may be formed from a zirconium oxide ($ZrO_2$) film. A second floating gate electrode film 15 is formed on the main insulating film 14. A polysilicon film is used as the floating gate electrode film 15.

Figure 2:
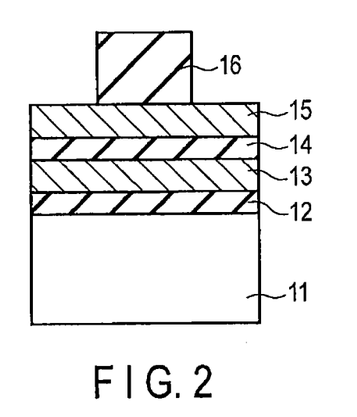
FIG. 2 is a sectional view schematically showing part of the method of manufacturing the semiconductor device according to the first embodiment.

As shown in FIG. 2, a mask pattern 16 is formed on the floating gate electrode film 15.

Figure 3:
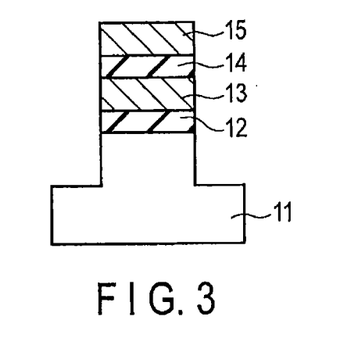
FIG. 3 is a sectional view schematically showing part of the method of manufacturing the semiconductor device according to the first embodiment.

As shown in FIG. 3, the floating gate electrode film 15, the main insulating film 14, the floating gate electrode film 13, the tunnel insulating film 12, and the semiconductor substrate 11 are patterned (etched) using the mask pattern 16 as a mask. An element region defined by an isolation trench is thus formed.

Figure 4:
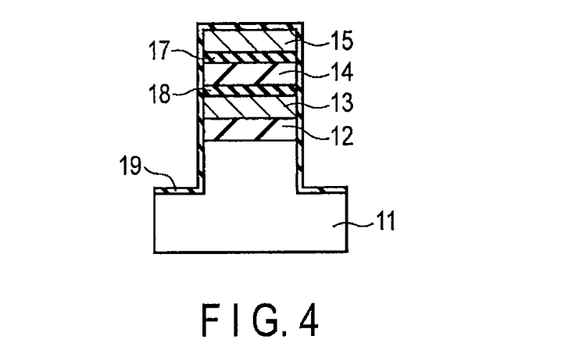
FIG. 4 is a sectional view schematically showing part of the method of manufacturing the semiconductor device according to the first embodiment.

As shown in FIG. 4, oxidation is performed in an oxidation atmosphere. Oxygen, ozone ($O_3$), water ($H_2O$), or the like is used as the oxidant contained in the oxidation atmosphere. This oxidant is activated by the catalytic action of the hafnium oxide or zirconium oxide used as the main insulating film 14 to oxidize the polysilicon used as the floating gate electrode films 13 and 15.

With the oxidation, a portion of the floating gate electrode film 15, which is located near the interface between the main insulating film 14 and the floating gate electrode film 15, is oxidized to form a silicon oxide film 17 between the main insulating film 14 and the floating gate electrode film 15. In addition, a portion of the floating gate electrode film 13, which is located near the interface between the main insulating film 14 and the floating gate electrode film 13, is oxidized to form a silicon oxide film 18 between the main insulating film 14 and the floating gate electrode film 13. The thus formed silicon oxide films 17 and 18 have negative fixed charges because of the insufficient oxidation. For this reason, the silicon oxide film 17 functions as the first fixed charge layer 17 having negative fixed charges, and the silicon oxide film 18 functions as the second fixed charge layer 18 having negative fixed charges. An inter-floating gate insulating film formed from the main insulating film 14, the first fixed charge layer 17, and the second fixed charge layer 18 is thus obtained.

Additionally, with the oxidation, a protective oxide film 19 is formed on the exposed surface of the stack structure including the semiconductor substrate 11, the tunnel insulating film 12, the floating gate electrode film 13, the inter-floating gate insulating film, and the floating gate electrode film 15.

Figure 5:
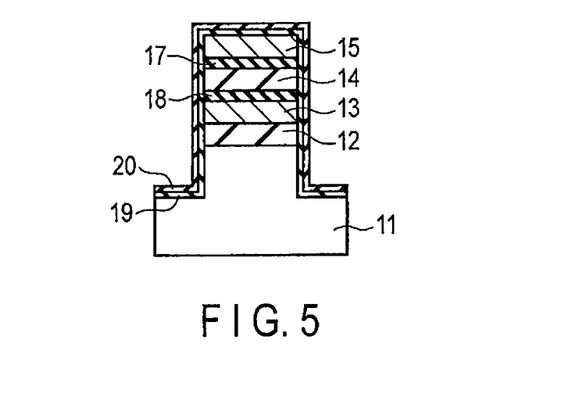
FIG. 5 is a sectional view schematically showing part of the method of manufacturing the semiconductor device according to the first embodiment.

As shown in FIG. 5, a silicon nitride film is formed on the protective oxide film 19 as a protective nitride film 20. The protective nitride film 20 is omitted in some cases.

Figure 6:
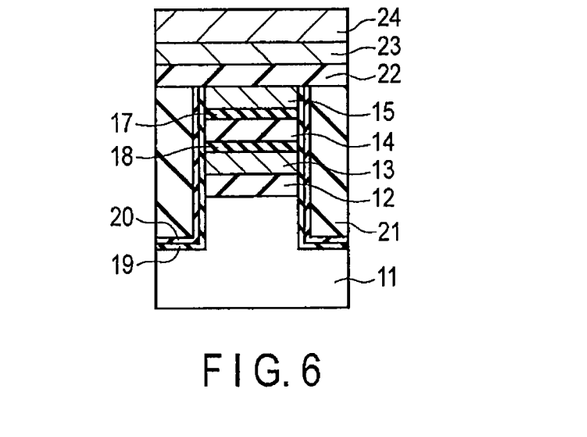
FIG. 6 is a sectional view schematically showing part of the method of manufacturing the semiconductor device according to the first embodiment.

As shown in FIG. 6, a silicon oxide film is formed on the protective nitride film 20 to form an isolation region 21. The silicon oxide film is planarized by CMP (chemical mechanical polishing) to form the isolation region 21 in the isolation trench. At the time of planarization, the protective oxide film 19 and the protective nitride film 20 formed on the upper surface of the floating gate electrode film 15 are removed to expose the upper surface of the floating gate electrode film 15.

An inter-electrode insulating film 22 is formed on the floating gate electrode film 15 and the isolation region 21. A stack film of a polysilicon film 23 and a metal film 24 is formed on the inter-electrode insulating film 22 as a control gate electrode film. The metal film 24, the polysilicon film 23, the inter-electrode insulating film 22, the floating gate electrode film 15, the inter-floating gate insulating film (the fixed charge layer 17, the main insulating film 14, and the fixed charge layer 18), and the floating gate electrode film 13 are patterned (etched). The pattern of the first floating gate electrode 13 and the second floating gate electrode 15 and the pattern of the control gate electrode (the polysilicon film 23 and the metal film 24) are thus formed.

A memory cell of a semiconductor device (nonvolatile semiconductor memory device) for a NAND flash memory is formed in the above-described way. That is, in the semiconductor device of this embodiment, the inter-floating gate insulating film includes the main insulating film 14, the first fixed charge layer 17 formed between the main insulating film 14 and the second floating gate electrode 15 and having negative fixed charges, and the second fixed charge layer 18 formed between the main insulating film 14 and the first floating gate electrode 13 and having negative fixed charges, as shown in FIG. 6.

Figure 7:
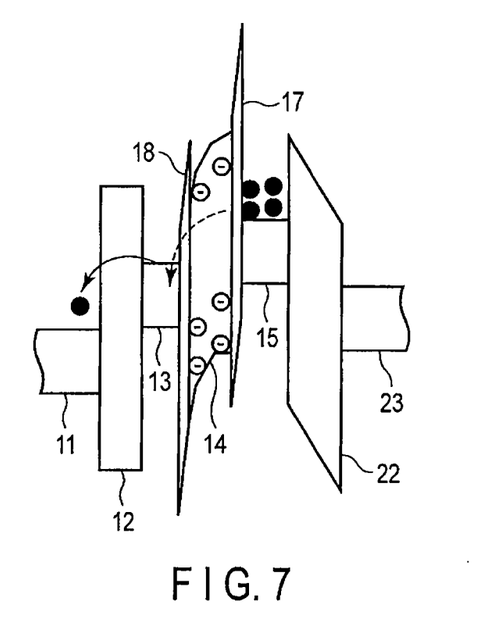
FIG. 7 is a view schematically showing the energy band structure of the semiconductor device according to the first embodiment.

FIG. 7 is a view schematically showing the energy band structure of the semiconductor device formed in the above-described manner.

As described above, in the semiconductor device of this embodiment, the first fixed charge layer 17 having negative fixed charges is formed between the main insulating film 14 and the second floating gate electrode 15, and the second fixed charge layer 18 having negative fixed charges is formed between the main insulating film 14 and the first floating gate electrode film 13. For this reason, the effective barrier height at the two ends of the inter-floating gate insulating film increases because of the fixed charge layers 17 and 18. That is, the barrier height of the inter-floating gate insulating film increases with respect to electrons accumulated in the floating gate electrode 15. This allows to suppress leakage of electrons accumulated in the floating gate electrode 15 to the floating gate electrode 13.

As described above, according to the semiconductor device of this embodiment, the fixed charge layers 17 and 18 having negative fixed charges allow to suppress leakage of electrons accumulated in the floating gate electrode 15 to the floating gate electrode 13 and thus improve the data retention characteristic of the semiconductor device.

Additionally, according to the method of manufacturing the semiconductor device of this embodiment, the fixed charge layers 17 and 18 are formed by oxidation and can therefore be formed by a simple process. More specifically, since the fixed charge layers 17 and 18 are formed by oxidation when forming the protective oxide film 19, the manufacturing process can be simplified.

Furthermore, when the main insulating film of the inter-floating gate insulating film is made of hafnium oxide or zirconium oxide, the oxidant can be activated by the catalytic action of the hafnium oxide or zirconium oxide. This allows to efficiently form the fixed charge layers 17 and 18.

In the above-described embodiment, hafnium oxide or zirconium oxide is used as the main insulating film of the inter-floating gate insulating film. However, any other material is also usable if it can form a fixed charge layer having negative fixed charges in accordance with the same procedure as that of the above-described embodiment.

In the above-described embodiment, polysilicon is used as the floating gate electrode films 13 and 15. However, any other material (for example, a metal) is also usable if an oxide layer formed in accordance with the same procedure as that of the above-described embodiment has negative fixed charges.

Second Embodiment

FIGS. 8, 9, 10, 11, 12, and 13 are sectional views schematically showing a method of manufacturing a semiconductor device (nonvolatile semiconductor memory device) according to the second embodiment. Note that the basic arrangement and the basic manufacturing method are the same as those of the above-described first embodiment. Hence, the same reference numerals as in the first embodiment denote corresponding constituent elements, and a detailed description of matters explained in the first embodiment will be omitted.

Figure 8:
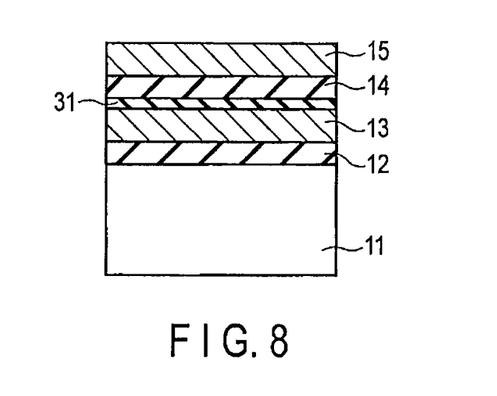
FIG. 8 is a sectional view schematically showing part of a method of manufacturing a semiconductor device according to the second embodiment.

First, as shown in FIG. 8, a tunnel insulating film 12 is formed on a semiconductor substrate 11, and a first floating gate electrode film 13 is formed on the tunnel insulating film 12, as in the first embodiment. In the second embodiment, an oxide film 31 is formed on the floating gate electrode film 13 in advance to prevent a layer having negative fixed charges from being formed between a main insulating film 14 and the floating gate electrode film 13. More specifically, a silicon oxide film is formed as the oxide film 31. Next, as in the first embodiment, the main insulating film 14 is formed on the oxide film 31. A hafnium oxide (HfO$_2$) film or a zirconium oxide (ZrO$_2$) film is used as the main insulating film 14, as in the first embodiment. Additionally, as in the first embodiment, a second floating gate electrode film 15 is formed on the main insulating film 14.

Figure 9:
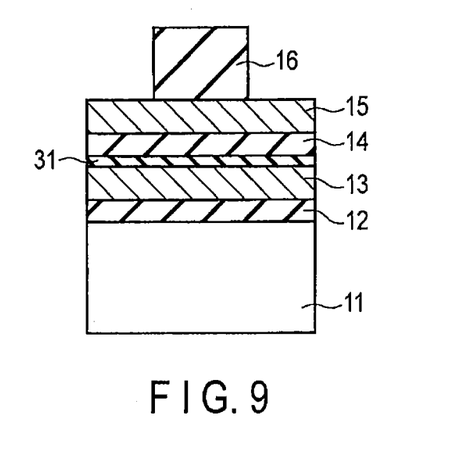
FIG. 9 is a sectional view schematically showing part of the method of manufacturing the semiconductor device according to the second embodiment.

As shown in FIG. 9, a mask pattern 16 is formed on the floating gate electrode film 15.

Figure 10:
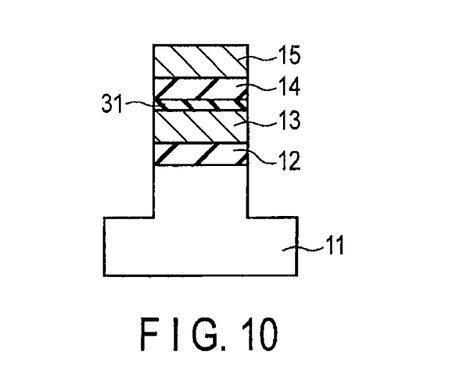
FIG. 10 is a sectional view schematically showing part of the method of manufacturing the semiconductor device according to the second embodiment.

As shown in FIG. 10, the floating gate electrode film 15, the main insulating film 14, the oxide film 31, the floating gate electrode film 13, the tunnel insulating film 12, and the semiconductor substrate 11 are patterned (etched) using the mask pattern 16 as a mask. An element region defined by an isolation trench is thus formed.

Figure 11:
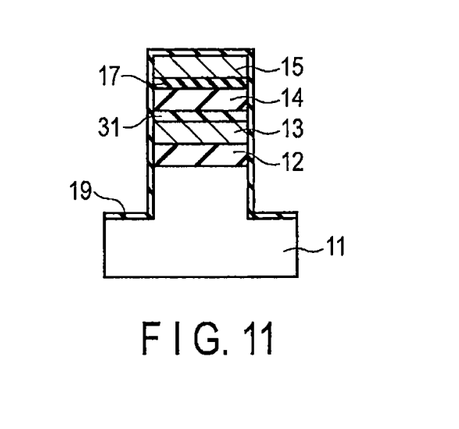
FIG. 11 is a sectional view schematically showing part of the method of manufacturing the semiconductor device according to the second embodiment.

As shown in FIG. 11, oxidation is performed in an oxidation atmosphere, as in the first embodiment. With the oxidation, a silicon oxide film serving as a first fixed charge layer 17 is formed between the main insulating film 14 and the floating gate electrode film 15, as in the first embodiment. On the other hand, no oxide film (layer having negative fixed charges) is formed between the main insulating film 14 and the floating gate electrode film 13 because the oxide film 31 has been formed in advance. In this embodiment, an inter-floating gate insulating film formed from the main insulating film 14, the first fixed charge layer 17, and the oxide film 31 is thus obtained.

Additionally, with the oxidation, a protective oxide film 19 is formed on the exposed surface of the stack structure including the semiconductor substrate 11, the tunnel insulating film 12, the floating gate electrode film 13, the inter-floating gate insulating film, and the floating gate electrode film 15.

Figure 12:
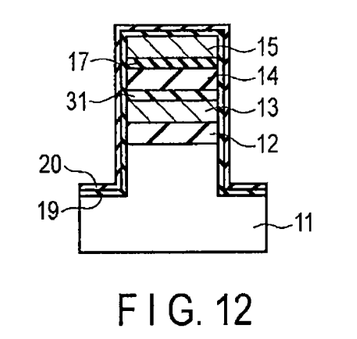
FIG. 12 is a sectional view schematically showing part of the method of manufacturing the semiconductor device according to the second embodiment.

As shown in FIG. 12, a protective nitride film 20 is formed on the protective oxide film 19, as in the first embodiment. The protective nitride film 20 may be omitted.

Figure 13:
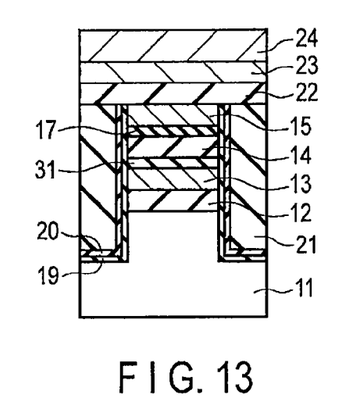
FIG. 13 is a sectional view schematically showing part of the method of manufacturing the semiconductor device according to the second embodiment.

As shown in FIG. 13, an isolation region 21 is formed, as in the first embodiment. An inter-electrode insulating film 22 and a control gate electrode film (a polysilicon film 23 and a metal film 24) are formed, as in the first embodiment. The metal film 24, the polysilicon film 23, the inter-electrode insulating film 22, the floating gate electrode film 15, the inter-floating gate insulating film (the fixed charge layer 17, the main insulating film 14, and the oxide film 31), and the floating gate electrode film 13 are patterned (etched). The pattern of the first floating gate electrode 13 and the second floating gate electrode 15 and the pattern of the control gate electrode (the polysilicon film 23 and the metal film 24) are thus formed.

A memory cell of a semiconductor device (nonvolatile semiconductor memory device) for a NAND flash memory is formed in the above-described way.

Figure 14:
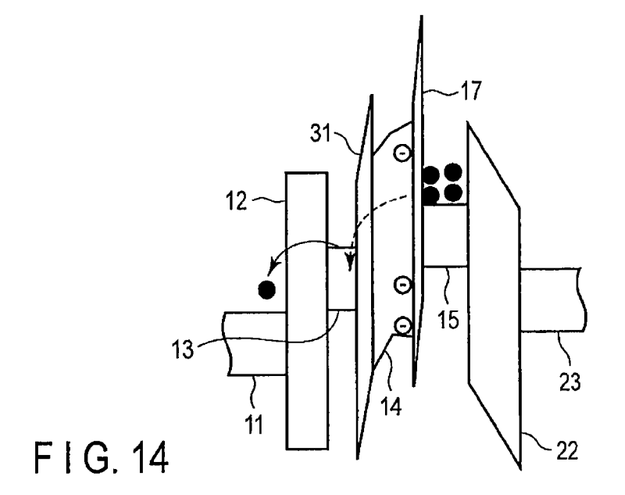
FIG. 14 is a view schematically showing the energy band structure of the semiconductor device according to the second embodiment.

FIG. 14 is a view schematically showing the energy band structure of the semiconductor device formed in the above-described manner.

In the semiconductor device of this embodiment, the first fixed charge layer 17 having negative fixed charges is formed between the main insulating film 14 and the second floating gate electrode 15. On the other hand, not a layer having negative fixed charges but the oxide film 31 is formed between the main insulating film 14 and the first floating gate electrode 13. If a layer having negative fixed charges is formed between the main insulating film 14 and the floating gate electrode 13, it may be an inhibiting factor at the time of write. In this embodiment, this problem can be avoided because no layer having negative fixed charges is formed between the main insulating film 14 and the floating gate electrode 13. On the other hand, the first fixed charge layer 17 having negative fixed charges is formed between the main insulating film 14 and the floating gate electrode 15. This allows to suppress leakage of electrons accumulated in the floating gate electrode film 15, as in the first embodiment.

As described above, according to the semiconductor device of this embodiment, it is possible to suppress leakage of electrons accumulated in the floating gate electrode 15 and thus improve the data retention characteristic without any adverse effect on the write characteristics, as in the first embodiment.

Third Embodiment

FIGS. 15, 16, 17, 18, 19, and 20 are sectional views schematically showing a method of manufacturing a semiconductor device (nonvolatile semiconductor memory device) according to the third embodiment. Note that the basic arrangement and the basic manufacturing method are the same as those of the above-described first embodiment. Hence, the same reference numerals as in the first embodiment denote corresponding constituent elements, and a detailed description of matters explained in the first embodiment will be omitted.

Figure 15:
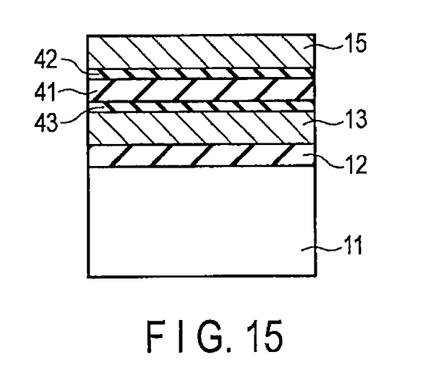
FIG. 15 is a sectional view schematically showing part of a method of manufacturing a semiconductor device according to the third embodiment.

First, as shown in FIG. 15, a tunnel insulating film 12 is formed on a semiconductor substrate 11, and a first floating gate electrode film 13 is formed on the tunnel insulating film 12, as in the first embodiment.

In the third embodiment, a preliminary insulating film 43 to generate negative fixed charges is formed on the floating gate electrode film 13 as the lower layer of an inter-floating gate insulating film. A main insulating film 41 of the inter-floating gate insulating film is formed on the preliminary insulating film 43. In addition, a preliminary insulating film 42 to generate negative fixed charges is further formed as the upper layer of the inter-floating gate insulating film. In this embodiment, all the main insulating film 41, the preliminary insulating film 42, and the preliminary insulating film 43 are made of silicon nitride. However, both the preliminary insulating films 42 and 43 are made of silicon nitride whose silicon composition ratio is higher than that of the main insulating film 41 (Si/N>3/4). The main insulating film 41 is made of silicon nitride that almost satisfies the stoichiometry (Si/N=3/4). Hence, the preliminary insulating films 42 and 43 are made of silicon-rich silicon nitride.

After that, as in the first embodiment, a second floating gate electrode film 15 is formed on the preliminary insulating film 42.

Figure 16:
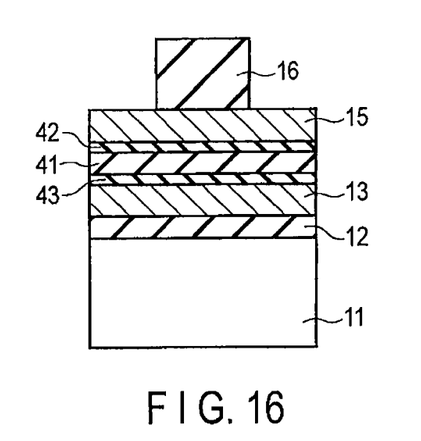
FIG. 16 is a sectional view schematically showing part of the method of manufacturing the semiconductor device according to the third embodiment.

As shown in FIG. 16, a mask pattern 16 is formed on the floating gate electrode film 15.

Figure 17:
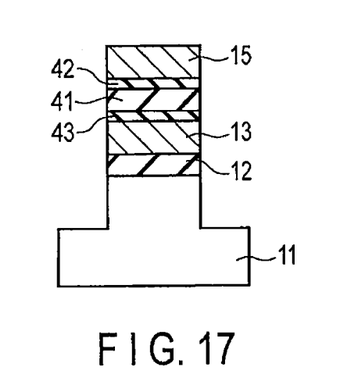
FIG. 17 is a sectional view schematically showing part of the method of manufacturing the semiconductor device according to the third embodiment.

As shown in FIG. 17, the floating gate electrode film 15, the preliminary insulating film 42, the main insulating film 41, the preliminary insulating film 43, the floating gate electrode film 13, the tunnel insulating film 12, and the semiconductor substrate 11 are patterned (etched) using the mask pattern 16 as a mask. An element region defined by an isolation trench is thus formed.

Figure 18:
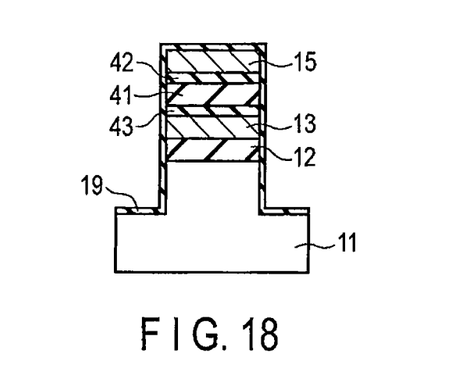
FIG. 18 is a sectional view schematically showing part of the method of manufacturing the semiconductor device according to the third embodiment.

As shown in FIG. 18, a protective oxide film 19 such as a silicon oxide film is formed on the exposed surface of the stack structure including the semiconductor substrate 11, the tunnel insulating film 12, the floating gate electrode film 13, the preliminary insulating film 43, the main insulating film 41, the preliminary insulating film 42, and the floating gate electrode film 15.

Figure 19:
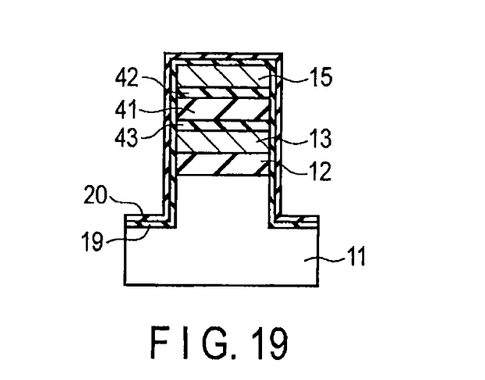
FIG. 19 is a sectional view schematically showing part of the method of manufacturing the semiconductor device according to the third embodiment.

As shown in FIG. 19, a protective nitride film 20 is formed on the protective oxide film 19, as in the first embodiment.

Figure 20:
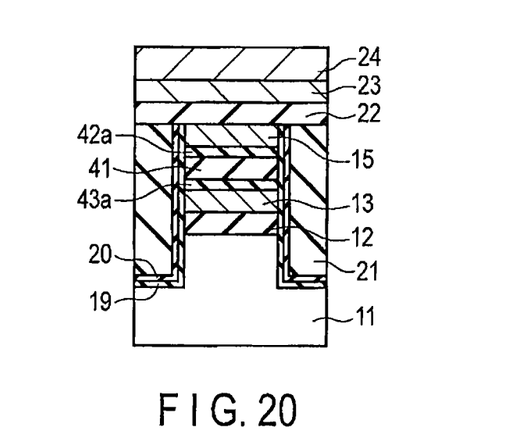
FIG. 20 is a sectional view schematically showing part of the method of manufacturing the semiconductor device according to the third embodiment.

As shown in FIG. 20, an isolation region 21 is formed, as in the first embodiment. An inter-electrode insulating film 22 and a control gate electrode film (a polysilicon film 23 and a metal film 24) are formed, as in the first embodiment. The metal film 24, the polysilicon film 23, the inter-electrode insulating film 22, the floating gate electrode film 15, the inter-floating gate insulating film (the preliminary insulating film 42, the main insulating film 41, and the preliminary insulating film 43), and the floating gate electrode film 13 are patterned (etched). The pattern of the first floating gate electrode 13 and the second floating gate electrode 15 and the pattern of the control gate electrode (the polysilicon film 23 and the metal film 24) are thus formed. In this way, a memory cell structure is formed.

After that, a process for generating negative fixed charges in the preliminary insulating films 42 and 43 is performed. More specifically, electrons are injected into the memory cell, and the injected electrons are extracted from the memory cell. Such an electron injection and extraction operation is performed at least once. As a result, a state in which the electrons are left in the preliminary insulating films 42 and 43 is obtained. Such a state can be obtained because the preliminary insulating films 42 and 43 contain many traps. The electrons are thus introduced into the preliminary insulating films 42 and 43 so as to form a first fixed charge layer 42a and a second fixed charge layer 43a which have negative fixed charges.

Note that the above-described electron injection and extraction operation can be performed in accordance with the same procedure as that of write and erase operations for the memory cell. Hence, the above-described electron injection and extraction operation is preferably performed after the end of interconnection and package formation and the like. That is, the operation is preferably performed after the structure of the semiconductor memory product is completed.

A semiconductor device (nonvolatile semiconductor memory device) for a NAND flash memory according to this embodiment is completed in the above-described way.

As described above, according to the semiconductor device of this embodiment, the fixed charge layers 42a and 43a having negative fixed charges enable to suppress leakage of electrons accumulated in the floating gate electrode 15 and thus improve the data retention characteristic of the semiconductor device, as in the first embodiment.

According to the method of manufacturing the semiconductor device of this embodiment, the preliminary insulating films 42 and 43 are formed, and the fixed charge layers 42a and 43a are formed by the electron injection and extraction operation. Hence, the fixed charge layers 42a and 43a can be formed by a simple process.

In the above-described embodiment, a silicon nitride film is used as each of the main insulating film and the preliminary insulating films of the inter-floating gate insulating film. However, any other material is also usable if it can form a fixed charge layer having negative fixed charges in accordance with the same procedure as that of the above-described embodiment.

In the above-described embodiment, the preliminary insulating films 42 and 43 are formed. However, only the preliminary insulating film 42 may be formed without forming the preliminary insulating film 43. In this case, the fixed charge layer 42a having negative fixed charges is formed only between the main insulating film 41 and the floating gate electrode 15. Using this arrangement enables to improve the data retention characteristic without any adverse effect on the write characteristics, as in the second embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a semiconductor substrate;
   a tunnel insulating film formed on the semiconductor substrate;
   a first floating gate electrode formed on the tunnel insulating film;
   an inter-floating gate insulating film formed on the first floating gate electrode;
   a second floating gate electrode formed on the inter-floating gate insulating film;
   an inter-electrode insulating film formed on the second floating gate electrode; and
   a control gate electrode formed on the inter-electrode insulating film,
   the inter-floating gate insulating film comprising:
   a main insulating film;
   a first fixed charge layer formed between the main insulating film and the second floating gate electrode and having negative fixed charges; and
   a second fixed charge layer formed between the main insulating film and the first floating gate electrode and having negative fixed charges.

2. The device according to claim 1, further comprising a protective insulating film formed on a side surface of a stack structure formed of the tunnel insulating film, the first floating gate electrode, the inter-floating gate insulating film, and the second floating gate electrode.

3. The device according to claim 1,
   wherein the main insulating film is made of hafnium oxide or zirconium oxide.

4. The device according to claim 1,
   wherein each of the first floating gate electrode and the second floating gate electrode is formed from a polysilicon film.

5. The device according to claim 1,
   wherein the first fixed charge layer is formed from an oxide film.

6. A semiconductor device comprising:
   a semiconductor substrate;
   a tunnel insulating film formed on the semiconductor substrate;
   a first floating gate electrode formed on the tunnel insulating film;
   an inter floating gate insulating film formed on the first floating gate electrode;
   a second floating gate electrode formed on the inter floating gate insulating film;
   an inter electrode insulating film formed on the second floating gate electrode; and a control gate electrode formed on the inter electrode insulating film, the inter floating gate insulating film comprising:

a main insulating film; and a first fixed charge layer formed between the main insulating film and the second floating gate electrode and having negative fixed charges, wherein the main insulating film is made of silicon nitride, and the first fixed charge layer is made of silicon nitride whose silicon composition ratio is higher than that of the main insulating film.

7. The device according to claim 1, wherein the first fixed charge layer is made of silicon-rich silicon nitride.

8. A method of manufacturing the semiconductor device according to claim 1, comprising:

forming the tunnel insulating film on the semiconductor substrate;

forming a first floating gate electrode film on the tunnel insulating film;

forming the main insulating film of the inter-floating gate insulating film on the first floating gate electrode film;

forming a second floating gate electrode film on the main insulating film;

forming the first fixed charge layer having negative fixed charges by oxidizing a portion of the second floating gate electrode film, which is located near an interface between the main insulating film and the second floating gate electrode film, and forming the second fixed charge layer having negative fixed charges by oxidizing a portion of the first floating gate electrode film, which is located near an interface between the main insulating film and the first floating gate electrode film.

9. The method according to claim 8, further comprising forming an oxide film on the first floating gate electrode film in advance in order to prevent a layer having negative fixed charges from being formed at a portion of the first floating gate electrode film, which is located near an interface between the main insulating film and the first floating gate electrode film, wherein the main insulating film is formed on the oxide film formed in advance.

10. The method according to claim 8, wherein in forming the first fixed charge layer, a protective insulating film is formed on an exposed surface of a stack structure formed of the tunnel insulating film, the first floating gate electrode film, the main insulating film, and the second floating gate electrode film.

11. The method according to claim 8, wherein the main insulating film is made of hafnium oxide or zirconium oxide.

12. The method according to claim 8, wherein each of the first floating gate electrode film and the second floating gate electrode film is formed from a polysilicon film.

13. A method of manufacturing the semiconductor device according to claim 1, comprising:

forming the tunnel insulating film on a semiconductor substrate;

forming a first floating gate electrode film on the tunnel insulating film;

forming the main insulating film of the inter-floating gate insulating film on the first floating gate electrode film;

forming, on the main insulating film, a preliminary insulating film to generate negative fixed charges;

forming a second floating gate electrode film on the preliminary insulating film;

forming the first fixed charge layer having negative fixed charges by introducing electrons into the preliminary insulating film, and forming the second fixed charge layer having negative fixed charges by oxidizing a portion of the first floating gate electrode film, which is located near an interface between the main insulating film and the first floating gate electrode film.

14. The method according to claim 13, wherein the main insulating film is made of silicon nitride, and the preliminary insulating film is made of silicon nitride whose silicon composition ratio is higher than that of the main insulating film.

15. The method according to claim 13, wherein the preliminary insulating film is made of silicon-rich silicon nitride.

16. The method according to claim 13, wherein forming the first fixed charge layer includes injecting electrons into the preliminary insulating film and extracting the injected electrons.

17. The device according to claim 6, further comprising a protective insulating film formed on a side surface of a stack structure formed of the tunnel insulating film, the first floating gate electrode, the inter-floating gate insulating film, and the second floating gate electrode.

18. The device according to claim 6, wherein each of the first floating gate electrode and the second floating gate electrode is formed from a polysilicon film.

19. The device according to claim 6, wherein the first fixed charge layer is made of silicon-rich silicon nitride.

* * * * *